US009953966B2

(12) United States Patent
Miao et al.

(10) Patent No.: US 9,953,966 B2
(45) Date of Patent: Apr. 24, 2018

(54) SEMICONDUCTOR DEVICE AND METHOD OF FORMING THE SAME

(71) Applicant: TAIWAN SEMICONDUCTOR MANUFACTURING COMPANY LTD., Hsinchu (TW)

(72) Inventors: Chia-Chun Miao, Taichung (TW); Shih-Wei Liang, Taichung County (TW); Kai-Chiang Wu, Hsinchu (TW); Yen-Ping Wang, Changhua County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/995,687

(22) Filed: Jan. 14, 2016

(65) Prior Publication Data

US 2016/0133618 A1 May 12, 2016

Related U.S. Application Data

(60) Division of application No. 14/209,535, filed on Mar. 13, 2014, now Pat. No. 9,263,405, which is a
(Continued)

(51) Int. Cl.
*H01L 23/48* (2006.01)
*H01L 25/00* (2006.01)
(Continued)

(52) U.S. Cl.
CPC .............. *H01L 25/50* (2013.01); *H01L 24/03* (2013.01); *H01L 24/05* (2013.01); *H01L 24/11* (2013.01);
(Continued)

(58) Field of Classification Search
CPC ......... H01L 25/50; H01L 24/03; H01L 24/05; H01L 24/11; H01L 25/0657
(Continued)

(56) References Cited

U.S. PATENT DOCUMENTS

2006/0291029 A1* 12/2006 Lin ..................... H01L 21/2885
257/622
2008/0265367 A1* 10/2008 Tan .......................... H01L 24/81
257/531
(Continued)

*Primary Examiner* — Whitney T Moore
*Assistant Examiner* — Herve Assouman
(74) *Attorney, Agent, or Firm* — WPAT, P.C., Intellectual Property Attorneys; Anthony King

(57) ABSTRACT

A semiconductor device having a semiconductor substrate is provided. The semiconductor substrate includes an integrated circuit, which includes multi-layer structured metallization and inter-metal dielectric. The integrated circuit is below a passivation, which is over a metal structure. The metal structure includes a metal pad and an under bumper metallurgy, which is over and aligned with the metal pad. The metal pad is electrically connected to the integrated circuit, and the under bumper metallurgy is configured to electrically connect to a conductive component of another semiconductor device. The integrated circuit further includes a conductive trace, which is below and aligned with the metal structure. The conductive trace is connected to a power source such that an electromagnetic field is generated at the conductive trace when an electric current from the power source passes through the conductive trace.

20 Claims, 8 Drawing Sheets

Related U.S. Application Data continuation of application No. 14/098,218, filed on Dec. 5, 2013, now Pat. No. 9,184,143.

(51) Int. Cl.
    *H01L 23/00*     (2006.01)
    *H01L 25/065*     (2006.01)
    *H01L 25/10*     (2006.01)

(52) U.S. Cl.
    CPC .......... H01L 24/81 (2013.01); H01L 25/0657 (2013.01); *H01L 24/13* (2013.01); *H01L 25/105* (2013.01); *H01L 2224/0401* (2013.01); *H01L 2224/05011* (2013.01); *H01L 2224/05022* (2013.01); *H01L 2224/05124* (2013.01); *H01L 2224/05572* (2013.01); *H01L 2224/05611* (2013.01); *H01L 2224/05644* (2013.01); *H01L 2224/05647* (2013.01); *H01L 2224/05655* (2013.01); *H01L 2224/05666* (2013.01); *H01L 2224/05671* (2013.01); *H01L 2224/05681* (2013.01); *H01L 2224/11015* (2013.01); *H01L 2224/11334* (2013.01); *H01L 2224/11849* (2013.01); *H01L 2224/131* (2013.01); *H01L 2224/13005* (2013.01); *H01L 2224/16145* (2013.01); *H01L 2224/16237* (2013.01); *H01L 2224/16245* (2013.01); *H01L 2224/812* (2013.01); *H01L 2224/81007* (2013.01); *H01L 2224/8112* (2013.01); *H01L 2224/81143* (2013.01); *H01L 2224/81191* (2013.01); *H01L 2224/81192* (2013.01); *H01L 2224/81815* (2013.01); *H01L 2224/83007* (2013.01); *H01L 2224/83121* (2013.01); *H01L 2225/06513* (2013.01); *H01L 2225/1058* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01); *H01L 2924/10333* (2013.01); *H01L 2924/10335* (2013.01); *H01L 2924/10342* (2013.01); *H01L 2924/12041* (2013.01); *H01L 2924/13091* (2013.01); *H01L 2924/14* (2013.01); *H01L 2924/15311* (2013.01); *H01L 2924/2064* (2013.01); *H01L 2924/20641* (2013.01); *H01L 2924/20642* (2013.01); *H01L 2924/3511* (2013.01); *H01L 2924/3841* (2013.01)

(58) Field of Classification Search
    USPC .................................................. 257/737, 777
    See application file for complete search history.

(56) References Cited

U.S. PATENT DOCUMENTS

| | | | |
|---|---|---|---|
| 2010/0244276 A1* | 9/2010 | Burleson | H01L 24/17 257/777 |
| 2012/0313236 A1* | 12/2012 | Wakiyama | H01L 23/544 257/734 |

\* cited by examiner

SEMICONDUCTOR DEVICE AND METHOD OF FORMING THE SAME

CROSS-REFERENCE TO RELATED APPLICATIONS

This application is a divisional of U.S. application Ser. No. 14/209,535, filed Mar. 13, 2014, which is a continuation in part of U.S. application Ser. No. 14/098,218, filed Dec. 5, 2013.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as via openings and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's input/output (I/O) pads and the substrate or lead frame of the package. Structurally, a bump is disposed on the surface of a semiconductor substrate. The bump is then treated to maintain its position on the semiconductor substrate.

In addition to Flip-chip packaging, Wafer level chip scale packaging (WLCSP) is currently widely used for its low cost and relatively simple processes. During the packaging process, bumps disposed on the semiconductor wafer are expected to maintain position at certain locations. Due to the miniature scale of modern integrated circuits, maintaining bump position has become a challenge. Bump bridging and/or shifting issues have been affecting the yield. As a result, there is a need to solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
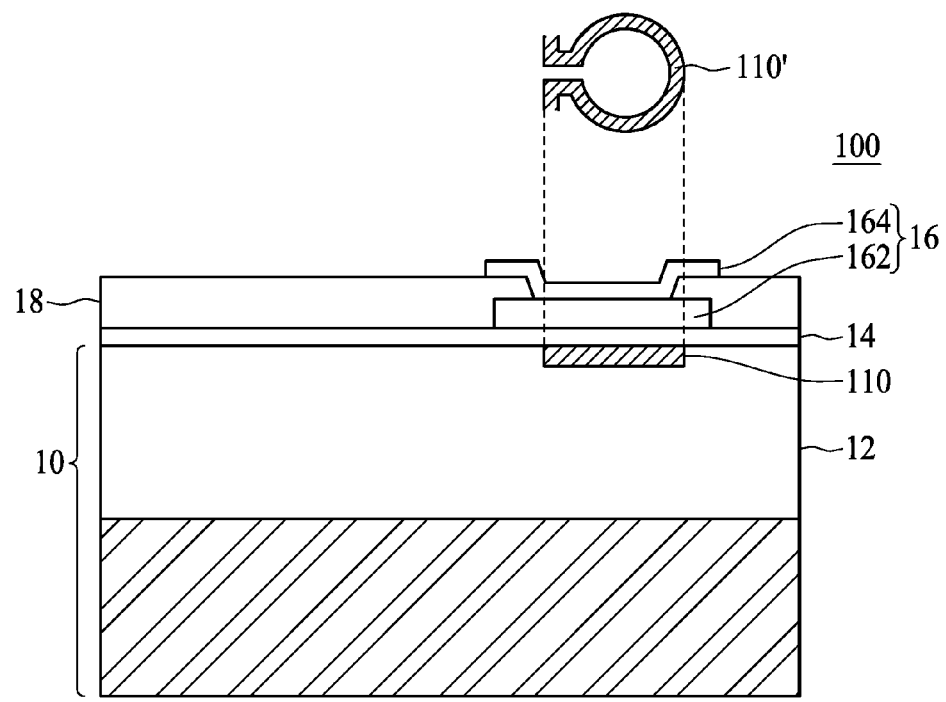
FIGS. 1A and 1B are portions of an exemplary semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, substrate can refer either to the work piece upon which deposition is desired, or the surface exposed to one or more deposition gases. For example, in certain embodiments, the substrate is a single crystal silicon wafer, a semiconductor-on-insulator ("SOI") substrate, or an epitaxial silicon surface, a silicon germanium surface, or an III-V material deposited upon a wafer. Work pieces are not limited to wafers, but also include glass, plastic, or other substrates employed in semiconductor processing. In some embodiments, the substrate has been patterned to have two or more different types of surfaces, such as both semiconductor and insulator surfaces. Examples of insulator materials include silicon dioxide, including low dielectric constant forms, such as carbon-doped and fluorine-doped oxides of silicon, silicon nitride, metal oxide and metal silicate. In certain embodiments, silicon-containing layers are selectively formed over single crystal semiconductor materials while allowing for minimal or zero growth of material over adjacent insulators. According to some embodiments, any material growth over adjacent insulators may be amorphous or polycrystalline non-epitaxial growth.

In certain embodiments, the word "substrate" in the present disclosure represents a patterned substrate that has a first surface having a first surface morphology and a second surface having a second surface morphology. Even if surfaces are made from the same elements, the surfaces are considered different if the morphologies or crystallinity of the surfaces are different. Amorphous and crystalline are examples of different morphologies. Polycrystalline morphology is a crystalline structure that consists of a disorderly arrangement of orderly crystals and thus has an intermediate degree of order. The atoms in a polycrystalline material are ordered within each of the crystals, but the crystals themselves lack long range order with respect to one another. Single crystal morphology is a crystalline structure that has a high degree of long range order. Epitaxial films are characterized by an in-plane crystal structure and orientation that is identical to the substrate upon which they are grown, typically single crystal. The atoms in these materials are arranged in a lattice-like structure that persists over relatively long distances on an atomic scale. Amorphous morphology is a non-crystalline structure having a low degree of order because the atoms lack a definite periodic arrangement. Other morphologies include microcrystalline and mixtures of amorphous and crystalline material. "Non-epitaxial" thus encompasses amorphous, polycrystalline, microcrystalline and mixtures of the same. As used herein, "single-crystal" or "epitaxial" are used to describe a predominantly large crystal structure having a tolerable number of faults therein, as is commonly employed for transistor fabrication. The crystallinity of a layer generally falls along a continuum from amorphous to polycrystalline to single-crystal; a crystal structure is often considered single-crystal or epitaxial despite a low density of faults. Specific examples of patterned substrates having two or more different types of surfaces, whether due to different morphologies and/or different materials, include without limitation: single crystal/polycrystalline, single crystal/amorphous, single crystal/dielectric, conductor/dielectric, and semiconductor/dielectric.

Figure 1B:
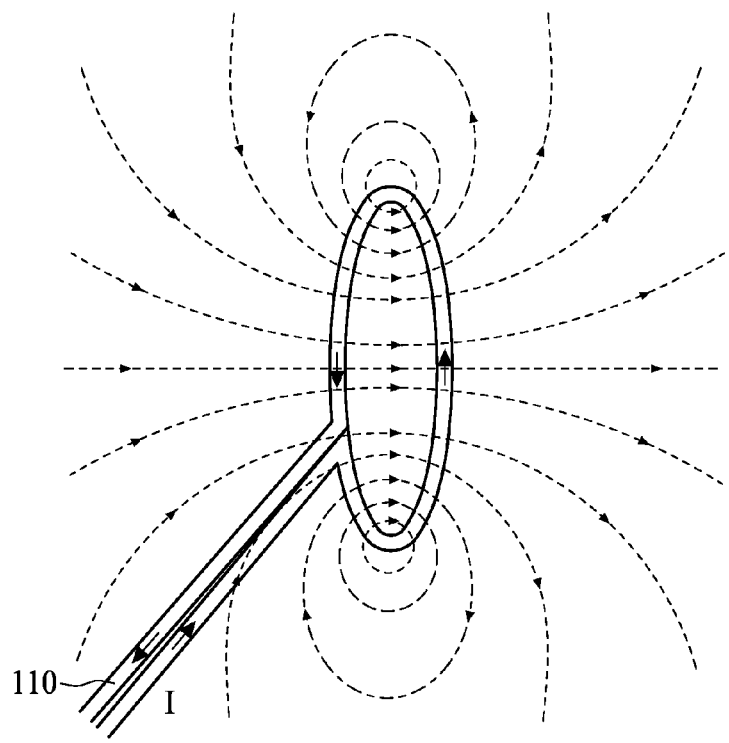

FIGS. 1A and 1B are portions of an exemplary semiconductor device in accordance with some embodiments of the present disclosure.

Referring to FIG. 1A, a portion of a semiconductor device 100 is shown, in accordance with some embodiments. The semiconductor substrate 10 includes silicon substrate. Alternatively, the semiconductor substrate 10 may include other elementary semiconductor such as germanium. The semiconductor substrate 10 may also include a compound semiconductor such as silicon carbide, gallium arsenic, indium arsenide, and indium phosphide. The semiconductor substrate 10 may include an alloy semiconductor such as silicon germanium, silicon germanium carbide, gallium arsenic phosphide, and gallium indium phosphide. In certain embodiments, the semiconductor substrate 10 includes an epitaxial layer. For example, the substrate may have an epitaxial layer overlying a bulk semiconductor. Furthermore, the semiconductor substrate 10 may include a semiconductor-on-insulator (SOI) structure. For example, the substrate may include a buried oxide (BOX) layer formed by a process such as separation by implanted oxygen (SIMOX) or other suitable technique, such as wafer bonding and grinding. In some embodiments, the semiconductor substrate 10 includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The semiconductor substrate 10 may further include other functional features such as a resistor or a capacitor formed in and on the substrate. In certain embodiments, the semiconductor substrate 10 further includes lateral isolation features provided to separate various devices formed in the semiconductor substrate 10. In some embodiments, shallow trench isolation (STI) features are used for lateral isolation. The various devices further include silicide disposed on S/D, gate and other device features for reduced contact resistance when coupled to the output and input signals.

In some embodiments in accordance with the present disclosure, the semiconductor substrate 10 includes an integrated circuit (IC) device 12 therein. The IC device includes one or more components therein. For example, the IC device 12 includes circuitry, inter-layer dielectric (ILD), an inter-metal dielectric (IMD), metallization, metal line, metal pad, conductive pad, protective layer, passivation, interconnect, and so on. Through the patterning, connections and cooperation of the structures of the IC device 12, the semiconductor device 100 is designed to perform desirable functions. The internal structures of the integrated circuit (IC) device 12 are omitted in FIG. 1A for clarity and details of such structures will be discussed later.

In some embodiments in accordance with the present disclosure, a passivation 14 is provided over the IC device 12. In certain embodiments, one or more passivations are formed and patterned over the IC device 12. In some embodiments, the passivation 14 is formed of a dielectric material, such as undoped silicate glass (USG), silicon nitride, silicon oxide, silicon oxynitride or a non-porous material by any suitable method, such as CVD, PVD, or the like. The passivation 14 is formed to cover the IC device 12. In certain embodiments, the passivation 14 allows electrical connection between the IC device 12 and the electrical components above the passivation 14. For example, the passivation 14 is configured to expose a portion of the IC device 12 through an opening or via. The passivation 14 is a single layer or a laminated layer. In FIG. 1A, a single layer of passivation 14 integrating a metal structure 16 are shown for illustrative purposes only. As such, other embodiments may include any number of passivations and/or metal structures.

In some embodiments in accordance with the present disclosure, the metal structure 16 is provided over the passivation 14. The metal structure 16 is incorporated with another passivation 18. In certain embodiments, the passivations are integrated such that there is no clear distinction between the passivation 14 and passivation 18. The metal structure is configured to receive a conductive component of another semiconductor device (not depicted) such that the other semiconductor device may be electrically connected with the semiconductor device 100.

In some embodiments in accordance with the present disclosure, the metal structure 16 includes a metal pad 162 and an under bump metallization (UBM) 164. The metal pad 162 is electrically connected with the IC device 12. In certain embodiments, the metal pad is made of Aluminum. The UBM 164 is formed over and aligned with the metal pad 162. In addition, the UBM 164 is formed in the recess of the passivation 18 by using metal deposition, photolithography or etching methods. In some embodiments, the UBM 164 includes at least one metallization layer comprising titanium (Ti), tantalum (Ta), titanium nitride (TiN), tantalum nitride (TaN), copper (Cu), copper alloys, nickel (Ni), tin (Sn), gold (Au), or combinations thereof. In some embodiments, the UBM 164 includes at least one Ti-containing layer and at least one Cu-containing layer. In some embodiments, the top surface of the UBM 164 has a recess. The UBM 164 is configured to receive the conductive component, such as a solder or a bump, of the other semiconductor device.

Accordingly, the IC device 12 is electrically connected with the other semiconductor device through the metal pad 162 and the UBM 164.

In some embodiments in accordance with the present disclosure, the conductive component of another semiconductor device is a bump, a solder or any semiconductor structure containing a ferromagnetic material. In addition, the conductive component is capable of being applied in a semiconductor manufacturing process, e.g., a flip-chip (FC) or wafer level chip scale packaging (WLCSP) process. In certain embodiments, after the bump is deposited onto the metal structure 16, the bump is further treated, such as reflowing. Consequently, the bump is maintained at a specific position on the metal structure 16. In some embodiments, more than one bump is positioned on the metal structure 16. In addition, the arranging pattern of the more than one bump is adjusted according to the needs of specific semiconductor devices, as will be deemed reasonable by persons having ordinary skill in the art.

In some embodiments in accordance with the present disclosure, a conductive trace 110 is provided within the IC device 12. Alternatively, the conductive trace 110 is provided at, on, within, between or as part of any structure(s) below the passivation 14. In certain embodiments, the conductive trace 110 is separated from the IC device 12 by the passivation 14. Due to different functions and requirements for the semiconductor device 100, the conductive trace 110 may or may not in contact with the passivation 14.

In some embodiments in accordance with the present disclosure, the conductive trace 110 is aligned with the metal pad 162. Consequently, the conductive trace 110 is aligned with the UBM 164. In certain embodiments, the conductive trace 110 substantially forms a loop. An opening is preserved at the conductive trace so as to ensure an electric current passes through in a specific direction, for example, clockwise or counter-clockwise. In some embodiments, the body of the conductive trace 110 is substantially c-shaped (as shown by numbering 110' in FIG. 1A). It is to be noted that the perimeter of the conductive trace 110 is not limited to curvy. For example, in some embodiments, the conductive trace 110 is quadrilateral. Conductive trace of other shapes is within the contemplated scope of the present disclosure.

In addition, in some embodiments in accordance with the present disclosure, the conductive trace 110 is configured to connect to a power source (not depicted). Specifically, one end of the conductive trace 110 is configured to couple with a positive pole of the power source, and the other end of the conductive trace 110 is configured to couple with a negative pole of the power source. Thereafter, with reference to FIG. 1B, based on the Biot-Savart Law, when an electric current (represented with symbol "I" in the description hereinafter) from the power source passes through the conductive trace, an electromagnetic field is generated. It is to be noted that the electric current may flow in a different direction and still generate an electromagnetic field.

Referring to FIG. 1B, according to the Biot-Savart Law, the electromagnetic field is more concentrated at the center of the conductive trace 110 than that outside of the conductive trace 110. Therefore, an object containing magnetic or ferromagnetic material will be attracted to a position close to the center of the conductive trace 110 when such object is disposed near the conductive trace 110.

According to the foregoing, in some embodiments in accordance with the present disclosure, the position of the conductive component (not depicted) received by the metal structure 16 will be adjusted in response to the electromagnetic field generated. For example, the conductive component is repositioned to a location closer to the center of the conductive trace 110. Accordingly, in response to the electromagnetic field generated, the conductive component is aligned with the conductive trace 110, as well as the metal pad 162 and the UBM 164. In some embodiments where multiple conductive components are disposed on the metal structure and multiple conductive traces are disposed between the semiconductor substrate and the metal structure, each conductive component is kept a specific distance from one another in response to the electromagnetic fields generated. It is to be noted that the adjusted position of the conductive component is not only close to the center of the conductive trace. Conductive components being repositioned to other locations desirable for specific semiconductor devices being manufactured are within the contemplated scope of the present disclosure.

Figure 2A:
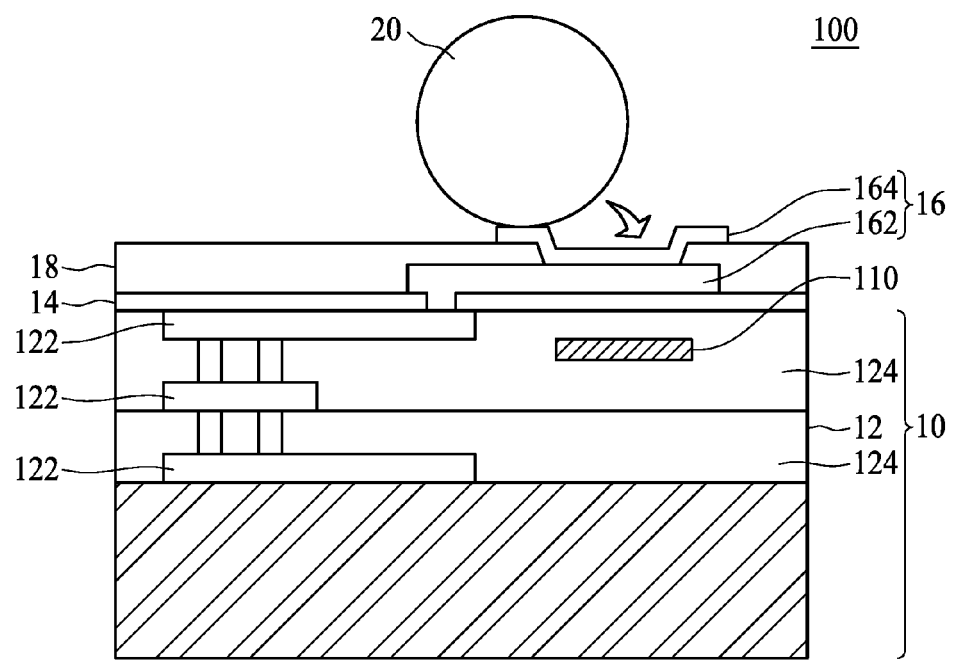
FIGS. 2A and 2B are cross-sectional views of a semiconductor device in accordance with some embodiments of the present disclosure.
Figure 2B:
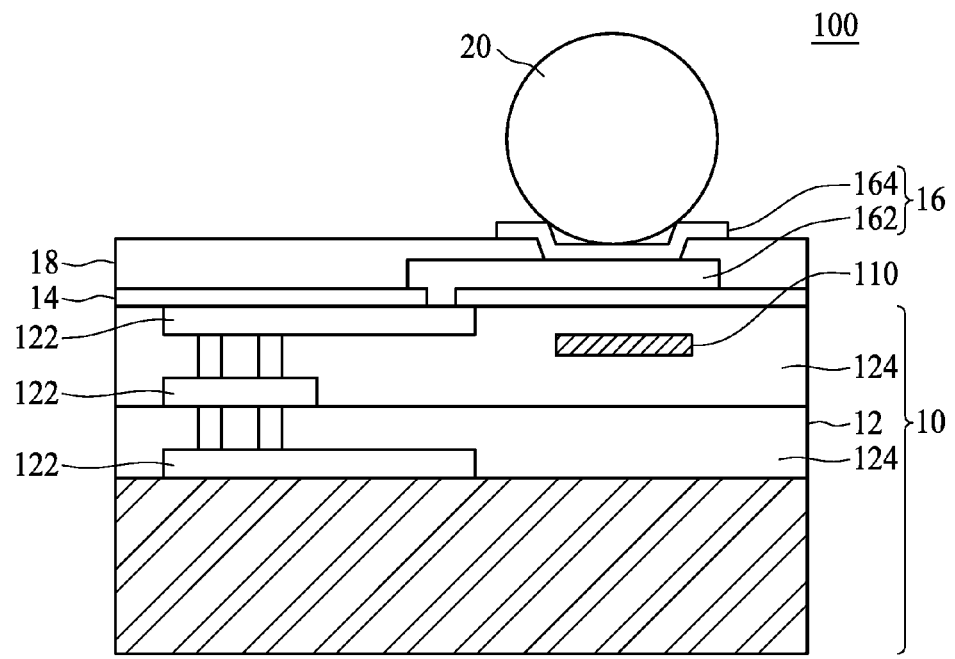

FIGS. 2A and 2B are cross-sectional views of a semiconductor device in accordance with some embodiments of the present disclosure.

Referring to FIG. 2A, in some embodiments in accordance with the present disclosure, a portion of a semiconductor substrate 10 of the semiconductor device 100 having IC device 12 formed thereon is shown. In addition, the IC device 12 formed on the semiconductor substrate 10 includes be any type of circuitry suitable for a particular application. In an embodiment, the IC device 12 includes electrical devices formed on the semiconductor substrate 10 with one or more dielectric layers overlying the electrical devices. Metal layers may be formed between dielectric layers to route electrical signals between the electrical devices. Electrical devices may also be formed in one or more dielectric layers. For example, the IC device 12 includes various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry is also used as appropriate for a given application.

In some embodiments in accordance with the present disclosure, the IC device 12 includes one or more metallization layers 122 and inter-metal dielectric (IMD) layers 124. Generally, the one or more IMD layers 124 and the associated metallization layers 122 (including metal lines, via openings and metal layers) are used to interconnect the IC device 12 to an external semiconductor device so as to provide an external electrical connection. The IMD layers 124 can be formed of a low-K dielectric material, such as FSG formed by PECVD techniques or high-density plasma CVD (HDPCVD), or the like, and can include intermediate etch stop layers. It should be noted that one or more etch stop layers (not shown) can be positioned between adjacent ones of the IMD layers 124. Generally, the etch stop layers provide a mechanism to stop an etching process when forming via openings and/or contacts. The etch stop layers are formed of a dielectric material having a different etch selectivity from adjacent layers, e.g., the semiconductor substrate 10 and the IMD layers 124. In some embodiments, etch stop layers can be formed of SiN, SiCN, SiCO, CN, combinations thereof, or the like, deposited by CVD or PECVD techniques.

In some embodiments in accordance with the present disclosure, the conductive trace 110 is positioned within the IC device 12. In addition, the conductive trace 110 is positioned at either of the IMD layers 124. In some embodiments, the conductive trace 110 is formed concurrently with one layer of the metallization 122. Thus, the conductive trace 110 is located at a same level of the concurrently formed layer. However, unlike the concurrently formed layer of the metallization 122, the conductive trace 110 is electrically isolate from the metallization 122 and operates independently. To be more specific, the conductive trace 110 is not designed to interconnect the IC device 12 to an external semiconductor device so as to provide an external electrical connection. Instead, the conductive trace 110 is used to generate electromagnetic field so as to align a conductor like bump 20 to attach on the UBM 164 from a remote distance. Accordingly, when the electric current flows from the power source, no unwanted interaction or interruption between the conductive trace 110 and the metallization 122 will be generated.

Still referring to FIG. 2A, a conductive component, such as a bump 20, is disposed on to the metal structure 16. The bump 20 includes ferromagnetic material. In some embodiments, the bump 20 is desired to be aligned with the central point of the metal structure 16. In other words, the bump 20 is expected to align with the metal pad 162 or the UBM 164. Nevertheless, due to the miniature scale of the modern semiconductor devices, such alignment might not be accomplished. In some embodiments in accordance with the present disclosure, the conductive trace 110 serves to align the bump 20 having ferromagnetic material by adjusting the position of the bump 20 using the electromagnetic field generated at the conductive trace 110. As illustrated in FIG. 2A, the bump 20 was first placed at an edge of the UBM 164. When electric current is provided to the conductive trace 110 so as to create the electromagnetic field, the bump 20 is attracted to a position closer to the center of the UBM 164, as well as the conductive trace 110. Thereafter, with reference to FIG. 2B, the position of the bump 20 is adjusted. In the words, the bump 20 is attracted closer to the central point of or the conductive trace 110. Since the metal structure 16 is aligned with or the conductive trace 110, the electromagnetic field generated at the conductive trace 110 serves to align the bump 20 with the metal structure 16 as well.

In some embodiments in accordance with the present disclosure, the conductive component is positioned on to the metal structure 16 through a ball dropping or ball placement process. In certain embodiments, the diameter or height of the conductive component is larger than about 200 μm. In some embodiments, the diameter or height of the conductive component is between about 50 μm and about 250 μm.

In some embodiments in accordance with the present disclosure, the electromagnetic field generated at the conductive trace 110 is between about 50 Gauss and about 150 Gauss.

Referring back to FIG. 2A, in some embodiments in accordance with the present disclosure, the conductive trace 110 is separated from the metal structure 16 by the passivation. A person having ordinary skill in the art would appreciate that the conductive trace 110 may be at any position under the passivation as long as the electromagnetic field generated is capable of adjusting the position of the conductive component disposed over the metal structure 16. In certain embodiments, the conductive trace 110 is not in contact with the passivation 14. In other words, the conductive trace 110 is separated from the passivation 14 and the metal structure 16 by the one or more IMD layers 124.

In subsequent cross-sectional drawings, the semiconductor substrate 10, IC device 12, metallization 122, IMD layer 124, and metal structure 16 may not be illustrated, and the passivation 18 may be formed as a part of the passivation 14.

FIGS. 3A-3D are perspective views of a semiconductor device in accordance with some embodiments of the present disclosure.

Figure 3A:
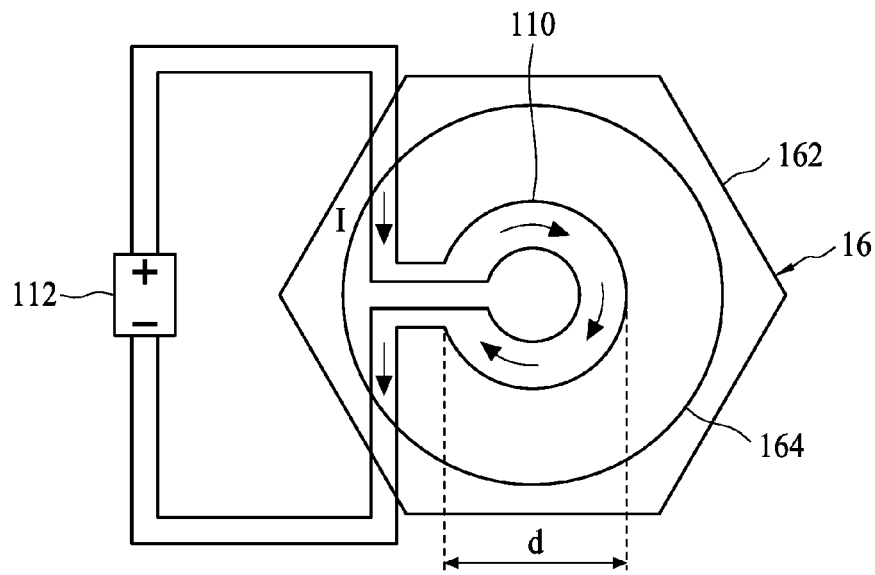
FIGS. 3A-3D are perspective views of a semiconductor device in accordance with some embodiments of the present disclosure.

Referring to FIG. 3A, in some embodiments in accordance with the present disclosure, a conductive trace 110 is provided between the semiconductor substrate having an IC device (not depicted) and the metal structure 16. Accordingly, the conductive trace 110 is over the semiconductor substrate, and below the metal pad 162 and the UBM 164. In addition, the conductive trace 110 is aligned with the metal structure. In other words, the central point of the conductive trace 110 is substantially aligned with the central point of the metal pad 162 or the UBM 164.

In some embodiments in accordance with the present disclosure, one end of the conductive trace 110 is configured to be coupled with one pole of a power source 112, and another end of the conductive trace 110 is configured to be coupled with another pole of the power source 112. The power source 112 is configured to provide electric current I to the conductive trace 110.

In some embodiments in accordance with the present disclosure, the conductive trace 110 is substantially a loop. In other words, an opening is preserved at the conductive trace 110 to ensure the electric current I passes through in a specific direction, for example, clockwise or counter-clockwise. In some embodiments, the conductive trace 110 is c-shaped, as illustrated in FIG. 3A. When the electric current I from the power source 112 runs through the c-shaped conductive trace 110, an electromagnetic field is generated at the c-shaped conductive trace 110 according to the Biot-Savart Law. In addition, the electromagnetic field is of a round dimension surrounding the central point of the conductive trace. When a conductive component (not depicted) is disposed on the UBM 164, the position of the conductive component is adjusted in response to the electromagnetic field. The conductive component further undergoes treatments, e.g., thermal reflow, to be secured to the UBM 164. As a result, the position of the conductive component on the UBM 164 is maintained substantially above the c-shaped conductive trace 110. Consequently, since the c-shaped conductive trace 110 is aligned with the metal pad 162, the conductive component is also aligned with the metal structure 162. As a result, the electromagnetic field generated at the c-shaped conductive trace 110 is configured to adjust the position of the conductive component on the UBM 164.

In some embodiments in accordance with the present disclosure, an outer dimension (represented with symbol "d") is between about 100 μm and about 300 μm. In certain embodiments, the outer dimension d is between about 180 μm and about 230 μm.

In some embodiments in accordance with the present disclosure, the amperage of the electric current I output by the power source 112 is between about 0.5 Amperes and about 2 Amperes. Moreover, the intensity of the electromagnetic field generated at the c-shaped conductive trace is between about 50 Gauss and about 150 Gauss. In certain embodiments, the amperage of the electric current I output by the power source 112 is between about 0.75 Amperes and about 1.25 Amperes. Moreover, the intensity of the electromagnetic field generated at the c-shaped conductive trace is between about 50 Gauss and about 75 Gauss.

Figure 3B:
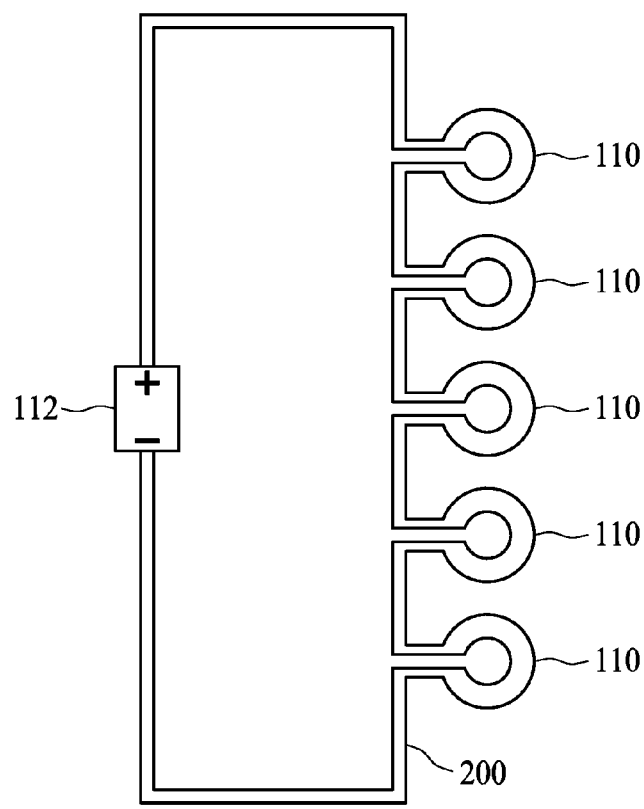

Referring to FIG. 3B, in some embodiments in accordance with the present disclosure, a string of c-shaped conductive traces 110 is provided within the IC device and below the metal structure. The IC device and the metal structure are omitted for clarity. The string of c-shaped conductive traces 110 is configured to be coupled to a power source 112 in a serial mode. When the electric current I from the power source 112 runs through the string of c-shaped conductive traces 110, electromagnetic fields are generated at each of the c-shaped conductive traces 110. Consequently, when multiple conductive components are disposed on the metal structure, positions of the bumps are adjusted respectively according to the electromagnetic field at each of the c-shaped conductive trace 110 below. In certain embodiments, when the multiple conductive components are part of one single semiconductor substrate, the attraction generated between the conductive components and the conductive traces 100 is configured to maintain the entire semiconductor substrate attached to the semiconductor device. In some embodiments, when the multiple conductive components are disposed at outer perimeters of such semiconductor substrate, warpage is prevented due to the attraction from the electromagnetic field.

In some embodiments, the string of c-shaped conductive traces 110 is a Daisy chain 200. The Daisy chain 200 is a wiring scheme in which multiple devices are wired together in sequence or in a ring. In certain embodiments, the Daisy chain 200 is used for transmission or detection of power, analog signals, digital data, or a combination thereof.

Figure 3C:
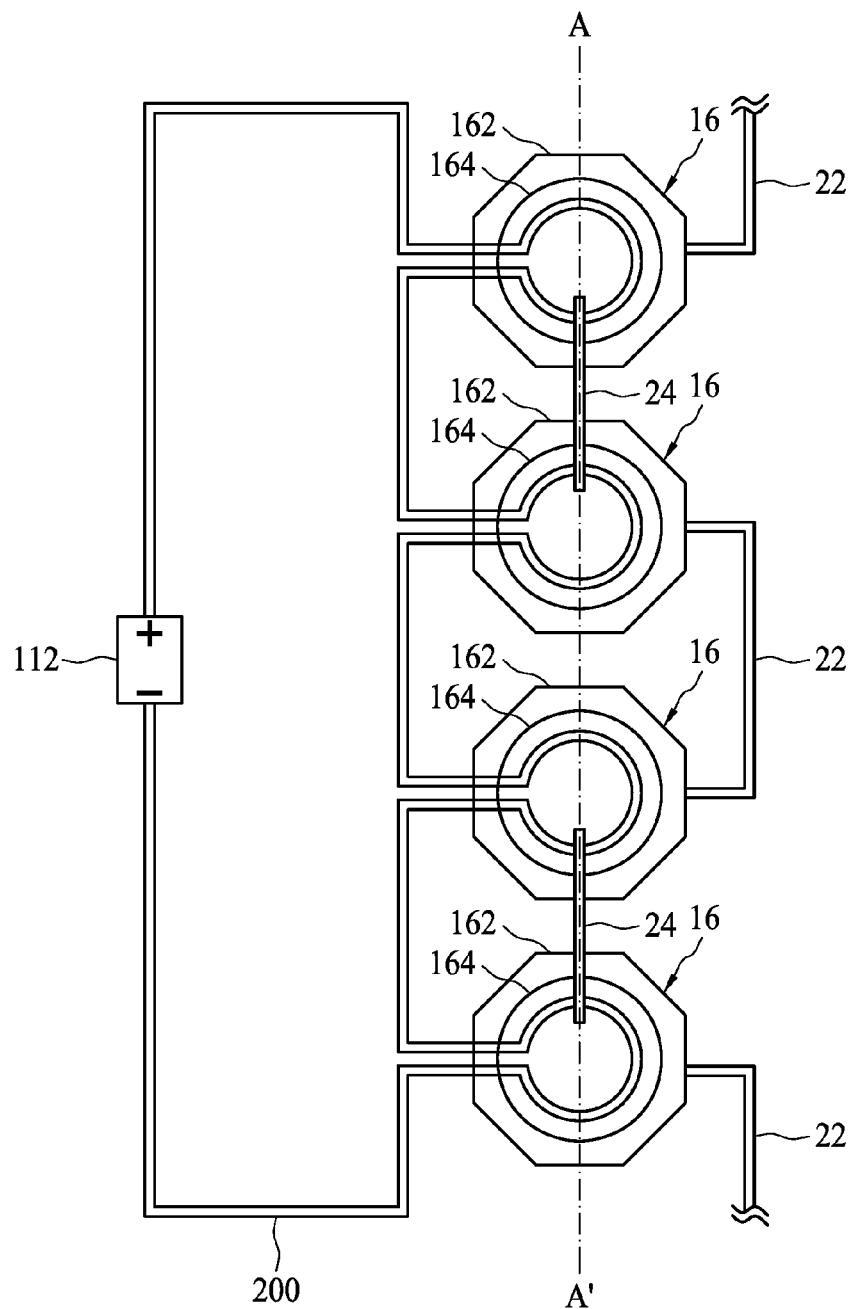

Referring to FIG. 3C, in some embodiments in accordance with the present disclosure, a Daisy chain 200 of a string of c-shaped conductive traces 110 is formed. Over each c-shaped conductive trace 110, a corresponding metal structure 16 having an UBM 164 over a metal pad 162 is provided. Accordingly, for each conductive component (not depicted) on the metal structure 16, a corresponding conductive trace 110 is provided so as to provide electromagnetic field to adjust the position of the conductive component. To be more specific, the conductive traces 100 are located within the IC device 12 and away from the conductive component. By supplying different volumes of electric current to the conductive traces 100, electromagnetic fields are generated so as to remotely align the conductive components disposed on the metal structure in a desired pattern. In some embodiments, such desired pattern is a linear pattern.

In some embodiments in accordance with the present disclosure, each metal structure 16 is electrically connected to the neighboring metal structures 16. The metal structures 16 are connected through the metal pads 162 by a conductive wire 22. In certain embodiments, the metal structures 16 are connected through the UBMs 164 by a portion of another semiconductor device 24. The portion of another semiconductor device 24 may be a printed circuit board (PCB) or a substrate in a flip-chip (FC) process. Alternatively, the portion of another semiconductor device 24 may be a conductive wire or any conductive component. As illustrated in FIG. 3C, in some embodiments in accordance with the present disclosure, the metal structures 16 are connected serially through the combination of conductive wires 22 and portions of semiconductor devices 24. Other styles or arrangements of connections between the metal structures are within the contemplated scope of the present disclosure.

Figure 3D:
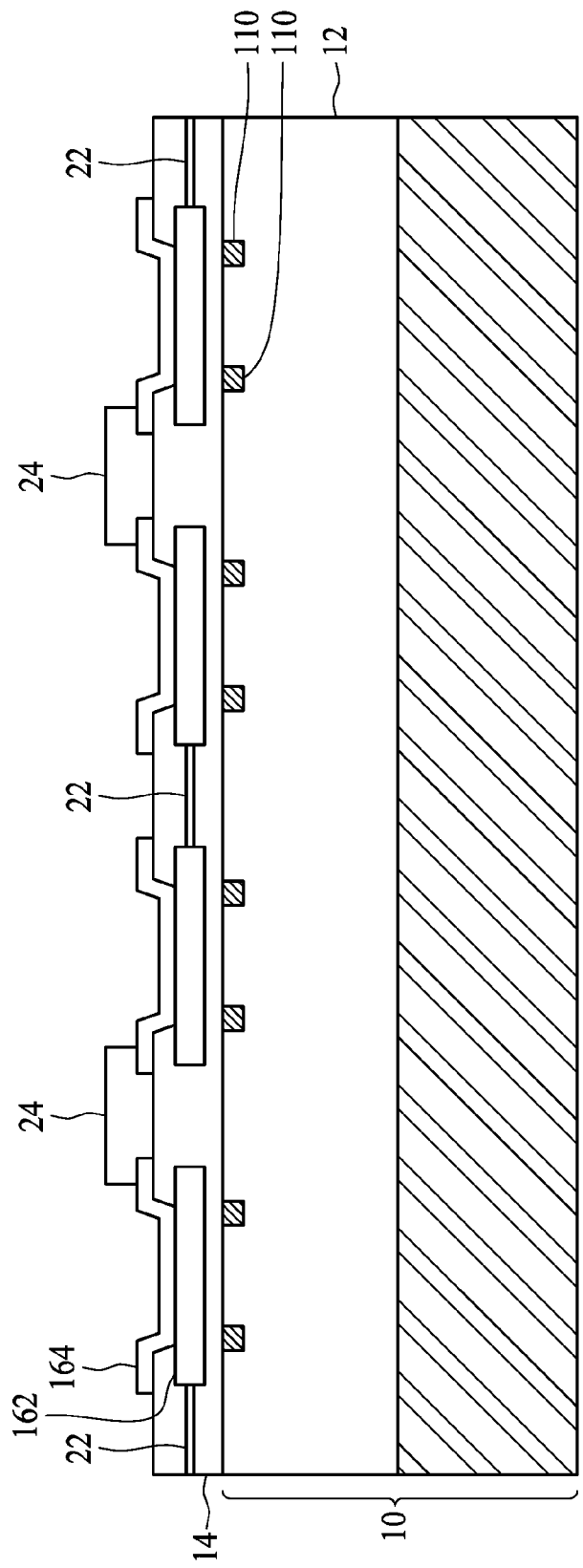

FIG. 3D is a cross-sectional view of the semiconductor device 100 along the dotted line A-A' according to some embodiments of the present disclosure. Beneath each set of metal pad 162 and UBM 164, a correspondingly aligned conductive trace 110 is provided. The conductive trace 110 is electrically isolated from the metal pad 162 and the metal structure 164 by the passivation 14. The conductive trace 110 is used to generate electromagnetic field so as to align a conductive component, such as a bump, a solder or a ball, to attach on the UBM 164 from a remote distance. The neighboring UBMs 164 are connected by a conductor. In certain embodiments, the conductor is a portion of another semiconductor device 24. (The other semiconductor device is omitted for clarity). In some embodiments, the neighboring metal pads 162 are connected by a conductive wire 22 disposed within the passivation 14. In certain embodiments, the connections between the sets of metal pads 162 and UBMs 164 serves to connect them in a serial manner. Different types of connections between the metal pads and the UBMs are within the contemplated scope of the present disclosure.

Figure 4:
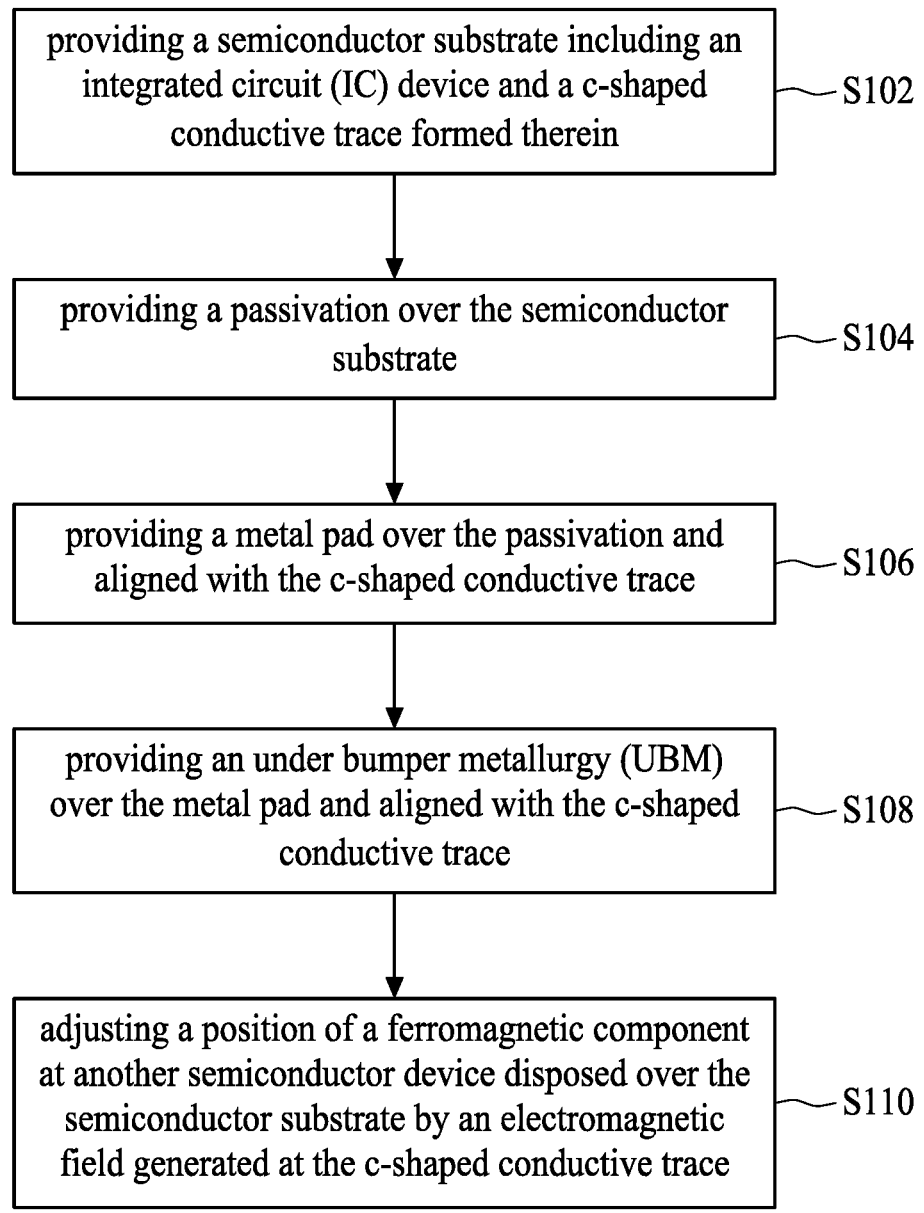
FIG. 4 is a semiconductor device manufacturing method in accordance with some embodiments of the present disclosure.

FIG. 4 is a semiconductor device manufacturing method in accordance with some embodiments of the present disclosure.

Referring to FIG. 4, with reference to FIG. 2A, in operation S102, a semiconductor substrate 10 having an IC device 12 is provided. The IC device 12 further includes a c-shaped conductive trace 110 therein. In certain embodiments, the c-shaped conductive trace 110 is formed with the IMD layer 124 of the IC device 12. As such, the c-shaped conductive trace 110 is electrically isolate from the metallization 122 and operates independently. To be more specific, the conductive trace 110 is not designed to interconnect the IC device 12 to an external semiconductor device so as to provide an external electrical connection.

In operation S104, a passivation 14 is formed over the semiconductor substrate 10. Accordingly, the passivation 14 is also over the c-shaped conductive trace 110. In operation S106, a metal pad 162 is provided over the passivation. In addition, the metal pad is aligned with the c-shaped conductive trace 110. Moreover, the metal pad 162 is configured to in electrical contact with the IC device 12. In operation S108, an UBM 164 is provided over the metal pad 162. The UBM 164 is aligned with the metal pad 162 as well as the c-shaped conductive trace 110. Furthermore, the UBM 164 is configured to receive a conductive component. In operation S110, another semiconductor device (not depicted) is disposed over the semiconductor device 100. The other semiconductor device includes ferromagnetic component (not depicted). The ferromagnetic component is disposed over the metal structure 16 and away from the conductive trace 110. Moreover, an electromagnetic field is generated at the c-shaped conductive trace 110. The electromagnetic field serves to adjust a position of the ferromagnetic component at the other semiconductor device from a remote distance. Consequently, the ferromagnetic component is aligned with the c-shaped conductive trace 110 as well as the metal pad 162 and/or the UBM 164 due to the electromagnetic field.

In some embodiments in accordance with the present disclosure, in one operation, an electric current is provided from a power source to the c-shaped conductive trace 110. The electromagnetic field is generated when the electric current passes through the c-shaped conductive trace 110 according to the Biot-Savart Law. Accordingly, the electromagnetic field generated at the c-shaped conductive trace 110 serves to adjust the position of the ferromagnetic component from a remote distance.

Figure 5A:
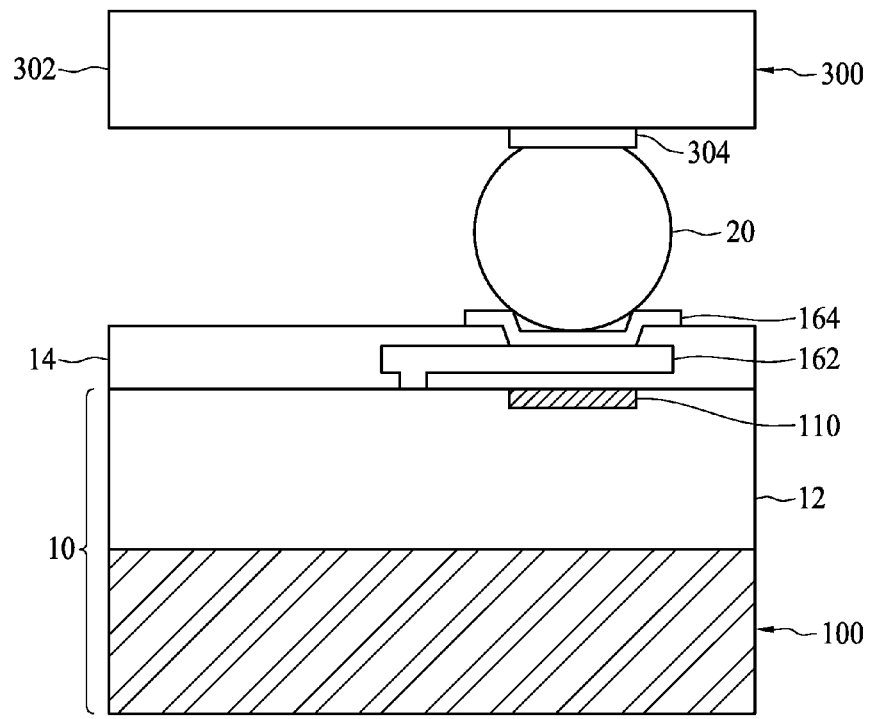
FIGS. 5A-5C are cross-sectional views of a semiconductor device in accordance with some embodiments of the present disclosure.
Figure 5B:
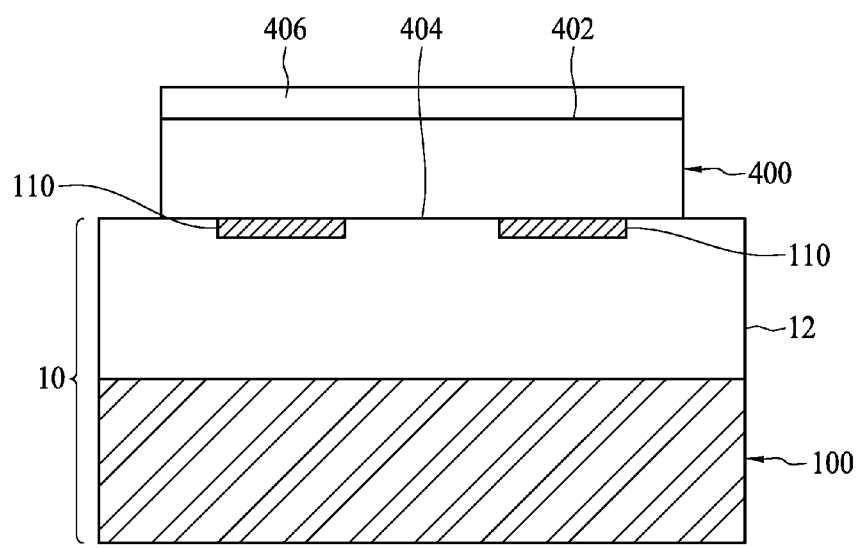
Figure 5C:
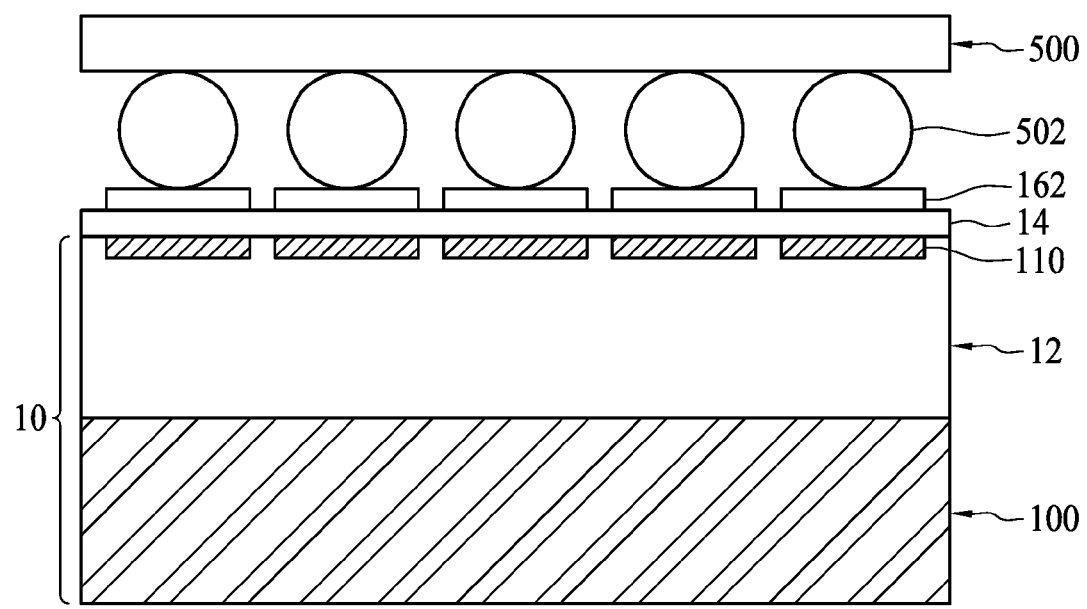

FIGS. 5A-5C are cross-sectional views of a semiconductor device in accordance with some embodiments of the present disclosure.

Referring to FIG. 5A, in some embodiments in accordance with the present disclosure, the semiconductor device 100 is configured to be bonded with another semiconductor device 300. For example, the semiconductor device 100 is bonded with the other semiconductor device 300 in a flip-chip (FC) process. In some embodiments, the semiconductor device 300 is a semiconductor package, a printed circuit board (PCB), a chip, a die or other similar devices. In some embodiments, the semiconductor device 300 includes a substrate 302, a pad 304 and a conductive component disposed on the substrate 302. In some embodiments, the substrate 302 includes a circuit therein. In some embodiments, the substrate 302 includes silicon, ceramic, copper or etc.

In some embodiments in accordance with the present disclosure, the pad 304 is electrically connected with the circuit within the substrate 302. In some embodiments, the pad 304 is configured for receiving a conductive component, such as a bump, ball or solder. In certain embodiments, the diameter or height of the conductive component is larger than about 200 μm. In some embodiments, the diameter or height of the conductive component is between about 50 μm and about 250 μm. In some embodiments, the pad 304 includes chromium (Cr), copper (Cu), gold (Au), titanium (Ti) or tungsten (W), etc. In certain embodiments, the conductive component is a bump 20. Details of the bump 20 have been described in the previous paragraphs and will not be repeated.

In some embodiments in accordance with the present disclosure, the semiconductor device 300 is mounted on the semiconductor device 100 by bonding the bump 20 with the UBM 164. Accordingly, the IC device 12 within the semiconductor substrate 10 is electrically connected with the circuit within the substrate 302 of the semiconductor device 300 through the metal pad 162, the UBM 164, the bump 20 and the pad 304.

In some embodiments in accordance with the present disclosure, when the semiconductor device 300 is first being mounted on to the semiconductor device 100, the bump 20 is not aligned with the UBM 164. Electric current will be provided from the power source to the conductive trace 110 so as to generate an electromagnetic field. The strength of the electromagnetic field is adjusted so as to affect the position of the bump 20 even though the conductive trace 110 is not in close proximity with the bump 20. Accordingly, the bump 20 is attracted by the electromagnetic field, and the position of the bump 20 is adjusted. As a result, the bump 20 is aligned with the UBM 164 such that the issue of bump shift (bump not aligned such that neighboring bumps become in contact with each other) or cold joint (thin or no connection between the connecting components) may be avoided.

In some embodiments, after being bonded with the semiconductor device 100 and the semiconductor device 300, a semiconductor package is formed as a final product or as an intermediate product for subsequent operations. In some embodiments, when both semiconductor devices 100 and 300 are a package respectively, a package on package (PoP) is formed.

Referring to FIG. 5B, in some embodiments in accordance with the present disclosure, a die having a first surface 402 and a second surface 404 opposite to the first surface 402 is disposed on the semiconductor substrate 100. The second surface 404 is disposed on and facing the semiconductor device 100. In other words, the first surface 402 is configured to face away from the semiconductor substrate 100. The first surface 402 is disposed with one or more conductive components 406. Through the electromagnetic field generated at the conductive trace 110, the position of the die 400 is adjusted due to the attraction received by the conductive component 406. In other words, the electromagnetic field is configured to adjust the position of the die 400 even though the conductive trace 110 is not in close proximity with the conductive component 406. Accordingly, the die 400 is aligned with a desired position defined by the conductive trace 110, and therefore, the issue of die shift may be avoided.

In some embodiments in accordance with the present disclosure, the die 400 is disposed on a wafer, such as a silicon wafer, or a carrier, such as a glass carrier. In certain embodiments, the wafer or the carrier does not include a semiconductor device. In other words, the semiconductor substrate 10 may not necessarily include the semiconductor device 100. Alternatively, the conductive traces 110 can be applied to any wafer or carrier structure as long as the conductive traces 110 are disposed at appropriate positions within the wafer or the carrier such that the position of the die 400 can be adjusted by the electromagnetic field generated.

Referring to FIG. 5C, in some embodiments in accordance with the present disclosure, a flip-chip attaching process is illustrated. A chip 500 having connectors 502 is attached to the semiconductor device 100. The connectors 502, which may be balls, bumps, or solders, are connected with the metal pads 162. After the chip 500 is disposed in place, a heat treatment such as thermal reflow is conducted to secure the connectors 502 to the metal pad 162. During the heat treatment, the chip 500 may encounter warpage. That is, the external perimeter of the chip 500 may lift and become a smiling shape such that some connectors 502 are not completely in contact with the metal pads 162. The electromagnetic field generated at the conductive trace 110 serves to pull the connectors 502 towards the metal pads 162 during the heat treatment. Accordingly, the connections between the connectors 502 and the metal pads 162 are maintained intact until after the heat treatment such that a secure bond is formed between the two. Consequently, the issue of warpage may be avoided as well as the issue of cold joint.

In some embodiments in accordance with the present disclosure, a semiconductor device is provided. The semiconductor device includes an integrated circuit (IC) device therein. The IC device includes metallization and inter-metal dielectric (IMD), which are integrated into a multi-layer structure within the IC device. A passivation is provided over the IC device, and a metal structure is provided over the passivation. The metal structure includes a metal pad and an under bumper metallurgy (UBM) over the metal pad. The metal pad is electrically connected with the IC device. The UBM is aligned with the metal pad. The UBM is further configured to receive and electrically connect to a conductive component of another semiconductor device. The IC device further includes a conductive trace disposed below the metal structure. In addition, the conductive trace is aligned with the metal structure. Moreover, the conductive trace is connected to a power source configured as a source of electric current. When the electric current from the power source passes through the conductive trace, an electromagnetic field is generated at the conductive trace accordingly.

In some embodiments in accordance with the present disclosure, a semiconductor device is provided. The semiconductor device includes an integrated circuit (IC) device. In addition, a metal structure is configured to overly the semiconductor substrate. The metal structure includes a metal pad and an under bumper metallurgy (UBM) over the metal pad. The UBM is further configured to be aligned with the metal pad. A conductive trace is disposed below the metal structure. The conductive trace is also aligned with and isolated from the metal structure. One end of the conductive trace is coupled with a first pole of a power source, and another end of the conductive trace is coupled with a second pole of the power source. When the power source outputs an electric current, such electric current is configured to run through the conductive trace so as to generate an electromagnetic field at the conductive trace. Accordingly, the electromagnetic field is configured to align a conductive component disposed on the UBM with the metal pad.

In some embodiments in accordance with the present disclosure, a method for manufacturing semiconductor device is provided. In one operation, a semiconductor substrate including an integrated circuit (IC) device having a c-shaped conductive trace formed therein is provided. In one operation, a passivation is provided over the semiconductor substrate. In one operation, a metal pad is provided over the passivation. In addition, the metal pad is aligned with the c-shaped conductive trace. In one operation, an under bumper metallurgy (UBM) is provided over the metal pad. In addition, the UBM is aligned with the c-shaped conductive trace. In one operation, an electromagnetic field generated at the c-shaped conductive trace. Such electromagnetic field is used to adjust a position of another semiconductor device disposed over the semiconductor substrate. In certain embodiments, the position of the other semiconductor device is manipulated through the electromagnetic force adjusting a position of a ferromagnetic component at the other semiconductor device The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing semiconductor device, comprising:
   providing a semiconductor substrate including an integrated circuit (IC) device and a plurality of metallization layers;
   forming a c-shaped conductive trace concurrently with one of the metallization layers, the c-shaped conductive trace being located at a same level with concurrently formed metallization layer without extending to other levels of non-concurrently formed metallization layers;
   forming a conductive pad over the c-shaped conductive trace;
   providing another semiconductor device having a conductive bump over a surface of the another semiconductor device;
   mounting the another semiconductor device on the semiconductor substrate;
   aligning the conductive bump with the conductive pad via adjusting a position of the conductive bump by an electromagnetic field generated at the c-shaped conductive trace.

2. The method according to claim 1, wherein the providing another semiconductor device having a conductive bump over the surface of the another semiconductor device comprises:
   disposing a conductive bump over a surface of the another semiconductor device facing the semiconductor substrate before adjusting the position of the conductive bump.

3. The method according to claim 2, wherein the conductive bump is composed of ferromagnetic materials.

4. The method according to claim 1, further comprising:
   providing an electric current to the c-shaped conductive trace so as to create the electromagnetic field.

5. The method according to claim 1, further comprising:
   providing a passivation layer over the semiconductor substrate;
   providing a metal pad over the passivation layer and aligned with the c-shaped conductive trace, wherein the passivation layer is between the metal pad and the c-shaped conductive trace.

6. The method according to claim 1, further comprising:
   performing a heat treatment over the semiconductor substrate and the another semiconductor device; and
   providing an electric current to the c-shaped conductive trace during the heat treatment.

7. The method according to claim 5, further comprising:
   providing an under bumper metallurgy (UBM) over the metal pad and aligned with the c-shaped conductive trace.

8. The method according to claim 7, wherein a height of the conductive bump is between about 50 μm and about 250 μm.

9. A method for manufacturing semiconductor device, comprising:
   providing a semiconductor substrate including an integrated circuit (IC) device and a plurality of metallization layers;
   forming a c-shaped conductive trace concurrently with one of the metallization layers, the c-shaped conductive trace being located at a same level with concurrently formed metallization layer without extending to other levels of non-concurrently formed metallization layers;
   forming a passivation layer over the semiconductor substrate;
   forming a metal pad over the passivation layer and aligned with the c-shaped conductive trace;
   providing an under bumper metallurgy (UBM) over the metal pad and aligned with the c-shaped conductive trace;
   providing another semiconductor device having a conductive bump over a surface of the another semiconductor device;
   mounting the another semiconductor device on the semiconductor substrate;
   adjusting a position of the conductive bump at another semiconductor device disposed over the semiconductor substrate by an electromagnetic field generated at the c-shaped conductive trace.

10. The method according to claim 9, further comprising:
    providing an electric current to the c-shaped conductive trace so as to create the electromagnetic field.

11. The method according to claim 9, further comprising:
increasing an intensity of the electromagnetic field at the c-shaped conductive trace so as to reduce warpage of the another semiconductor device.

12. The method according to claim 11, further comprising:
performing a heat treatment to bond the semiconductor substrate and the another semiconductor device.

13. The method according to claim 9, further comprising:
adjusting the position of the conductive bump at the another semiconductor device disposed over the semiconductor substrate by the electromagnetic field generated at the c-shaped conductive trace during a flip-chip (FC) operation.

14. A method for aligning semiconductor devices, comprising:
providing a first semiconductor device, comprising:
forming a Daisy chain of a c-shaped conductive trace in proximity to a first surface of the first semiconductor device;
providing a second semiconductor device including a conductive component over a second surface of the second semiconductor device; and
aligning the first semiconductor device and the second semiconductor device by facing the first surface with the second surface and generating an electromagnetic field at the c-shaped conductive trace.

15. The method according to claim 14, further comprising applying an electric current to the c-shaped conductive trace so as to generate the electromagnetic field.

16. The method according to claim 14, further comprising performing a heat treatment over the first semiconductor device and the second semiconductor device.

17. The method according to claim 14, wherein the aligning the first semiconductor device and the second semiconductor device comprises a flip chip operation.

18. A method for manufacturing semiconductor device, comprising:
providing a semiconductor substrate including an integrated circuit (IC) device and a c-shaped conductive trace formed therein;
forming a passivation over the semiconductor substrate;
forming a metal pad over the passivation and aligned with the c-shaped conductive trace;
providing an under bumper metallurgy (UBM) over the metal pad and aligned with the c-shaped conductive trace;
providing a conductive bump on the semiconductor substrate; and
aligning the conductive bump with the UBM via adjusting a position of the conductive bump by an electromagnetic field generated at the c-shaped conductive trace.

19. The method according to claim 18, wherein the c-shaped conductive trace formed in the semiconductor substrate comprises forming a Daisy chain of the c-shaped conductive trace.

20. The method according to claim 18, wherein the aligning the conductive bump with the UBM comprises:
placing the conductive bump at an edge of the UBM; and
providing electric current into the c-shaped conductive trace.

* * * * *